(12) United States Patent
Hasumi et al.

(10) Patent No.: US 7,714,600 B2
(45) Date of Patent: May 11, 2010

(54) LOAD FLUCTUATION CORRECTION CIRCUIT, ELECTRONIC DEVICE, TESTING DEVICE, AND TIMING GENERATING CIRCUIT

(75) Inventors: Takuya Hasumi, Tokyo (JP); Masakatsu Suda, Tokyo (JP)

(73) Assignee: Advantest Corporation, Tokyo (JP)

( * ) Notice: Subject to any disclaimer, the term of this patent is extended or adjusted under 35 U.S.C. 154(b) by 141 days.

(21) Appl. No.: 11/355,913

(22) Filed: Feb. 16, 2006

(65) Prior Publication Data

US 2006/0217912 A1  Sep. 28, 2006

(30) Foreign Application Priority Data

Feb. 17, 2005  (JP)  ............. 2005-041182

(51) Int. Cl.
*G01R 31/02* (2006.01)
(52) U.S. Cl. ................... 324/763; 324/158.1
(58) Field of Classification Search ............ 324/763, 324/158.1; 323/323, 299, 300; 327/60–90
See application file for complete search history.

(56) References Cited

U.S. PATENT DOCUMENTS

| | | | | |
|---|---|---|---|---|
| 5,914,631 A * | 6/1999 | Soneda | .................. | 327/535 |
| 6,157,231 A * | 12/2000 | Wasson | .................. | 327/156 |
| 6,157,247 A * | 12/2000 | Abdesselem et al. | .......... | 327/540 |
| 6,342,819 B1 * | 1/2002 | Yamada | .................. | 331/25 |
| 6,366,157 B1 * | 4/2002 | Abdesselem et al. | .......... | 327/535 |
| 6,400,643 B1 * | 6/2002 | Setogawa | .................. | 365/233.1 |
| 6,414,527 B1 * | 7/2002 | Seno et al. | .................. | 327/158 |
| 6,667,651 B2 * | 12/2003 | Hashiguchi | .................. | 327/538 |
| 6,924,679 B2 * | 8/2005 | Seno et al. | .................. | 327/158 |
| 7,061,292 B2 * | 6/2006 | Maksimovic et al. | .......... | 327/277 |
| 7,233,686 B2 * | 6/2007 | Hamid | .................. | 382/124 |

FOREIGN PATENT DOCUMENTS

JP  11-74768  3/1999

OTHER PUBLICATIONS

Patent Abstracts of Japan, Publication No. 11-074768, Publication Date: Mar. 16, 1999, 1 page.

* cited by examiner

*Primary Examiner*—Ha Tran T Nguyen
*Assistant Examiner*—Arleen M Vazquez
(74) *Attorney, Agent, or Firm*—Osha • Liang LLP

(57) ABSTRACT

To provide a load fluctuation correction circuit having a function of correcting the change in the current consumption amount due to the change in the driving state of a logic circuit, thereby suppressing the change in the source voltage applied to the logic circuit. The present invention provides a load fluctuation correction circuit for correcting the source voltage applied to a logic circuit, comprising: a delay circuit which is designed such that upon the source voltage which is to be supplied to the logic circuit is applied to the delay circuit as a power supply, it outputs a received cycle signal with a predetermined delay time, and which operates with the source voltage supplied to the logic circuit as a power supply; a current consumption circuit provided such that it shares a power supply with the logic circuit; and a phase comparison circuit which controls the current amount consumed by the current consumption circuit such that the phase difference between the cycle signal input to the delay circuit and the signal output from the delay circuit matches a predetermined period of time.

15 Claims, 6 Drawing Sheets

LOAD FLUCTUATION CORRECTION CIRCUIT, ELECTRONIC DEVICE, TESTING DEVICE, AND TIMING GENERATING CIRCUIT

CROSS REFERENCE TO RELATED APPLICATION

The present application claims priority from a Japanese Patent Application No. 2005-041182 filed on Feb. 17, 2005, the contents of which are incorporated herein by reference.

BACKGROUND OF THE INVENTION

1. Field of the Invention

The present invention relates to a load fluctuation correction circuit for correcting the source voltage supplied to a logic circuit, a timing generating circuit and a testing device including a load fluctuation correction circuit, and an electronic device including a load fluctuation correction circuit.

2. Related Art

With conventional integrated circuits and so forth, including logic circuits formed of CMOSs and so forth, the logic circuits are driven by source power received from an external circuit.

For example, an integrated circuit chip includes a power metal wiring layer connected to an external power supply via bonding wires or the like. Each logic circuit included in the integrated circuit receives source power through the power metal wiring layer thus connected to the external power supply. This means that multiple logic circuits are driven by a shared power supply.

With such a configuration, the source power applied to each logic circuit is dependent upon the driving states of other logic circuits. Specifically, the source current consumed by a logic circuit changes corresponding to the driving state of the logic circuit. The source power is supplied to the logic circuit via boding wires and a metal wiring layer as described above. Accordingly, change in the source current consumed by the surrounding logic circuits leads to change in the source voltage supplied to the logic circuit due to the resistances of the bonding wires and the metal wiring layer.

Such a logic circuit has load change characteristics in which the source voltage changes corresponding to the change in the consumed current. However, conventional techniques for correcting such change in the source voltage offer only a function of correcting low-frequency fluctuation in the source voltage.

As a technique for suppressing such a fluctuation in the source voltage, a balance circuit is known having a function of maintaining the constant source current consumed by all the circuits. The balance circuit has a mechanism as follows. That is to say, the transit time of the pulses passing through the logic circuits is detected. The current consumed by the logic circuits is calculated based upon the transit time thus detected. With the balance circuit, dummy current is consumed such that the sum of the consumed current thus calculated and the dummy current is kept at an approximately constant value as disclosed in Japanese Patent Application Publication No. 11-74768 (p. 4, FIG. 1).

However, conventional balance circuits require a great number of device components for detection of the transit time of pulses and calculation of the consumption current in the logic circuits. This leads to an increase in the scale of the circuits employed in such a conventional balance circuit. Furthermore, such great number of device components required for the aforementioned detection and calculation leads to increased overall consumption current in all circuits.

SUMMARY OF THE INVENTION

Accordingly, it is an object of the present invention to provide a load fluctuation correction circuit and an electronic device having a function of solving the aforementioned problems. The aforementioned object is achieved by a combination of features described in the independent claims. Furthermore, dependent claims provide specific arrangements having further advantages.

In order to solve the aforementioned problems, according to a first aspect of the present invention, a load fluctuation correction circuit which corrects the source voltage supplied to a logic circuit comprises: a delay circuit which is designed such that upon the source voltage which is to be supplied to the logic circuit being applied to the delay circuit as a power supply, the delay circuit outputs a received cycle signal with a predetermined delay time, and which operates with the source voltage as a power supply; a current consumption circuit provided such that it shares a power supply with the logic circuit; and a phase comparison circuit which controls the current amount consumed by the current consumption circuit such that the phase difference between the cycle signal input to the delay circuit and the signal output from the delay circuit matches the predetermined period of time.

The delay circuit may be designed such that upon the source current which is to be supplied to the logic circuit being applied to the delay circuit as a power supply, the delay circuit outputs the cycle signal with a delay of the cycle of the cycle signal multiplied by an integer. With such an arrangement, in a case that the signal output from the delay circuit has a phase lead with respect to the cycle signal, the phase comparison circuit instructs the current consumption circuit to consume a predetermined amount of current. On the other hand, in a case that the signal output from the delay circuit has a phase lag with respect to the cycle signal, the phase comparison circuit instructs the current consumption circuit to suppress the current consumption to approximately zero.

The delay circuit may be designed such that upon the source current which is to be supplied to the logic circuit being applied to the delay circuit as a power supply, the delay circuit outputs the cycle signal with a delay of the half cycle of the cycle signal multiplied by an integer. With such an arrangement, in a case that the inverted signal of the signal output from the delay circuit has a phase lead with respect to the cycle signal, the phase comparison circuit instructs the current consumption circuit to consume a predetermined amount of current. On the other hand, in a case that the inverted signal of the signal output from the delay circuit has a phase lag with respect to the cycle signal, the phase comparison circuit instructs the current consumption circuit to suppress the current consumption to approximately zero.

The phase comparison circuit may include a flip-flop in which the signal output from the delay circuit or the inverted signal thereof is input to a data input terminal thereof, and the cycle signal is input to a clock input terminal thereof. The current consumption circuit is preferably provided near the logic circuit.

The load fluctuation correction circuit may include multiple current consumption circuits and multiple phase comparison circuits provided corresponding to the multiple current consumption circuits. With such an arrangement, each of the phase comparison circuits includes: a fine delay unit which delays the cycle signal; and a phase comparator which controls the current amount consumed by the current consumption circuit such that the phase difference between the cycle signal delayed by the fine delay unit and the signal output from the delay circuit matches the predetermined period of time. Each of the fine delay units delays the cycle signal with a corresponding delay.

According to a second aspect of the present invention, an electronic device including a logic circuit, comprises: a power supply line which supplies electric power to the logic circuit; and a load fluctuation correction circuit which corrects the source voltage supplied to the logic circuit from the power supply line. With such an arrangement, the load fluctuation correction circuit includes: a delay circuit which is designed such that upon the source voltage which is to be supplied to the logic circuit being applied to the delay circuit as a power supply, the delay circuit outputs a received cycle signal with a predetermined delay time, and which operates. with the source voltage supplied to the logic circuit as a power supply; a current consumption circuit provided such that it shares a power supply with the logic circuit; and a phase comparison circuit which controls the current amount consumed by the current consumption circuit such that the phase difference between the cycle signal input to the delay circuit and the signal output from the delay circuit matches the predetermined period of time.

According to a third aspect of the present invention, a testing device which performs a test of a tested device, comprises: a pattern generating unit which generates a test pattern used for testing the tested device; a waveform shaping unit which creates a test signal to be supplied to the tested device based upon the test pattern; a timing generating circuit which generates a timing signal used for determining the phase of the test signal, and supplies the timing signal thus generated to the waveform shaping unit; and a determination unit which determines whether or not the tested device is acceptable based upon the output signal output from the tested device. With such an arrangement, the timing generating circuit includes: a variable delay circuit which delays each pulse contained in a reference clock signal received so as to create the timing signal; a power supply which supplies the source voltage to the variable delay circuit for driving the variable delay circuit; and a load fluctuation correction circuit which corrects the source voltage supplied to the variable delay circuit. The load fluctuation correction circuit includes: a delay circuit which is designed such that upon the source voltage which is to be supplied to the variable delay circuit being applied to the delay circuit as a power supply, the delay circuit outputs a received cycle signal with a predetermined delay time, and which operates with the source voltage supplied to the variable delay circuit as a power supply; a current consumption circuit provided such that it shares a power supply with the variable delay circuit; and a phase comparison circuit which controls the current amount consumed by the current consumption circuit such that the phase difference between the cycle signal input to the delay circuit and the signal output from the delay circuit matches the predetermined period of time.

According to a fourth aspect of the present invention, a timing generating circuit which generates a timing signal having a desired phase, comprises: a variable delay circuit which delays each pulse contained in a reference clock signal received so as to create the timing signal; a power supply which supplies source voltage to the variable delay circuit for driving the variable delay circuit; and a load fluctuation correction circuit which corrects the source voltage supplied to the variable delay circuit. With such an arrangement, the load fluctuation correction circuit includes: a delay circuit which is designed such that upon the source voltage which is to be supplied to the variable delay circuit being applied to the delay circuit as a power supply, the delay circuit outputs a received cycle signal with a predetermined delay time, and which operates with the source voltage as a power supply; a current consumption circuit provided such that it shares a power supply with the variable delay circuit; and a phase comparison circuit which controls the current amount consumed by the current consumption circuit such that the phase difference between the cycle signal input to the delay circuit and the signal output from the delay circuit matches the predetermined period of time.

The electronic device may include multiple logic circuits which share a common power supply and multiple load fluctuation correction circuits provided corresponding to the multiple logic circuits.

Note that the summary of the present invention described above is not a precise list including all the features required for the present invention. Also, various sub-combinations of the aforementioned features are also encompassed in the present invention.

As can be clearly understood from the aforementioned description, the present invention offers a function of correcting a change in the current consumption due to a change in the driving state of the logic circuit. This suppresses fluctuation of the source voltage applied to the logic circuit.

BRIEF DESCRIPTION OF THE DRAWINGS

FIG. 3A shows the operation of the phase comparison circuit 24 in a case that the output signal of a delay circuit 22 has a phase lead with respect to the cycle signal, and FIG. 3B shows the operation of the phase comparison circuit 24 in a case that the output signal of the delay circuit 22 has a phase lag with respect to the cycle signal.

DETAILED DESCRIPTION OF THE INVENTION

Description will be made below regarding the present invention with reference to the following embodiments. It should be understood that the present invention within the scope of the appended claims is not intended to be limited to the embodiments described below. Furthermore, all the combinations of the features described in the embodiments are not necessarily indispensable to the solving means of the present invention.

Figure 1:
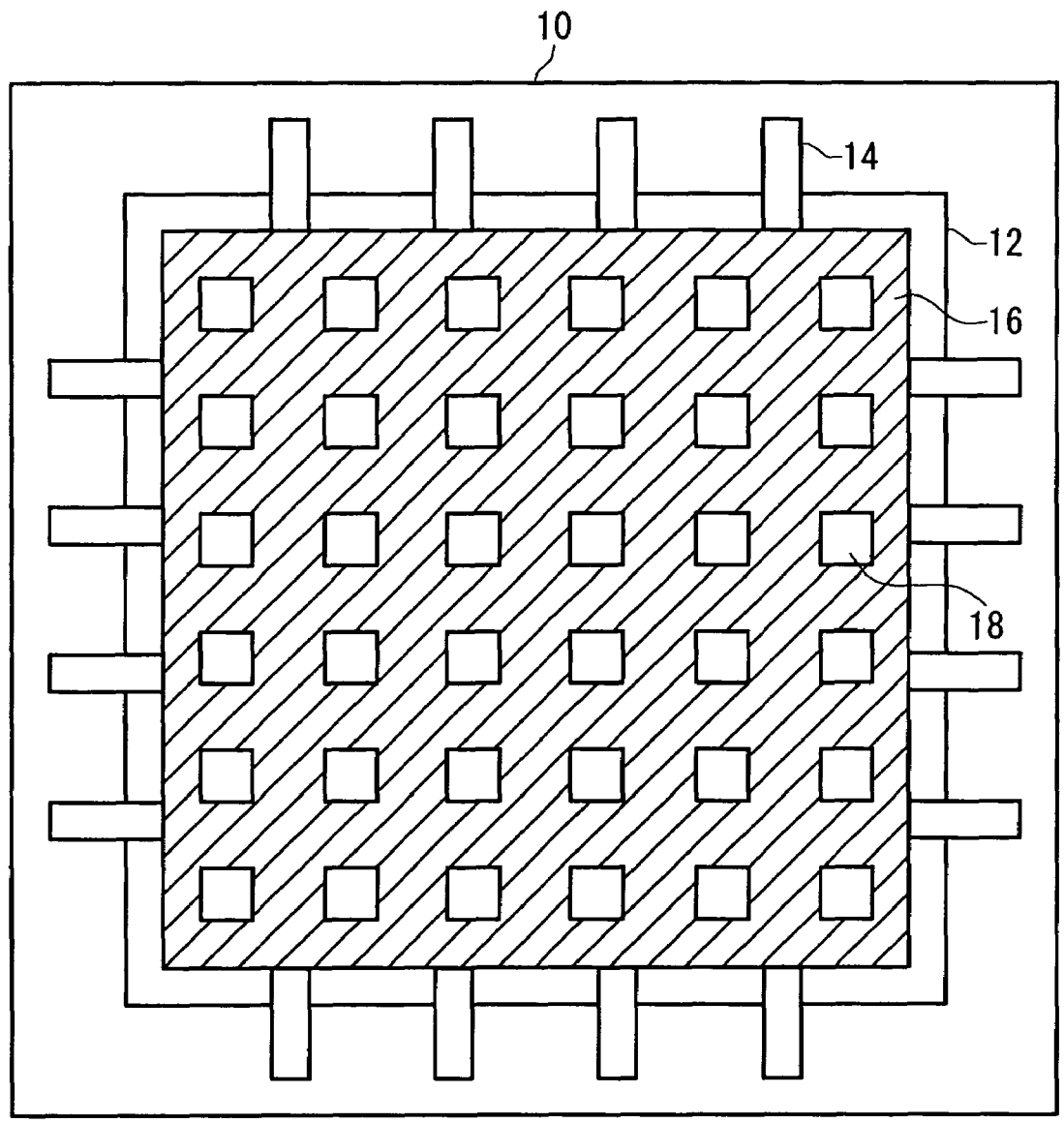
FIG. 1 is a diagram which shows an example of a configuration of an electronic device 100 according to the present embodiment.

FIG. 1 is a diagram which shows an example of a configuration of an electronic device 100 according to an embodiment of the present invention.

The electronic device 100 includes a package 10, an LSI chip 12, multiple logic circuits 18, bonding wires 14, and metal wiring patterns 16. The LSI chip 12 is mounted in the package 10. The package 10 enables signal exchange between the LSI chip 12 and external devices.

The metal wiring patterns 16 are formed on the LSI chip 12 in the form of a layer. These metal wiring patterns 16 are electrically connected to the power terminals of the multiple logic circuits 18. The bonding wires 14 electrically connect an external power supply and the metal wiring patterns 16. This means that the bonding wires 14 and the metal wiring patterns 16 serve as power supply lines for supplying source power to the logic circuits 18. Each logic circuit 18 is connected to a shared power supply line.

Furthermore, the electronic device 100 further includes a load fluctuation correction circuit 20 for each logic circuit 18, which is described later with reference to FIG. 2. Each load fluctuation correction circuit 20 is a circuit for correcting the source voltage supplied to the corresponding logic circuit 18. The load fluctuation correction circuit 20 is preferably provided near the corresponding logic circuit 18. Also, each logic circuit 18 may include a load fluctuation correction circuit 20.

Figure 2:
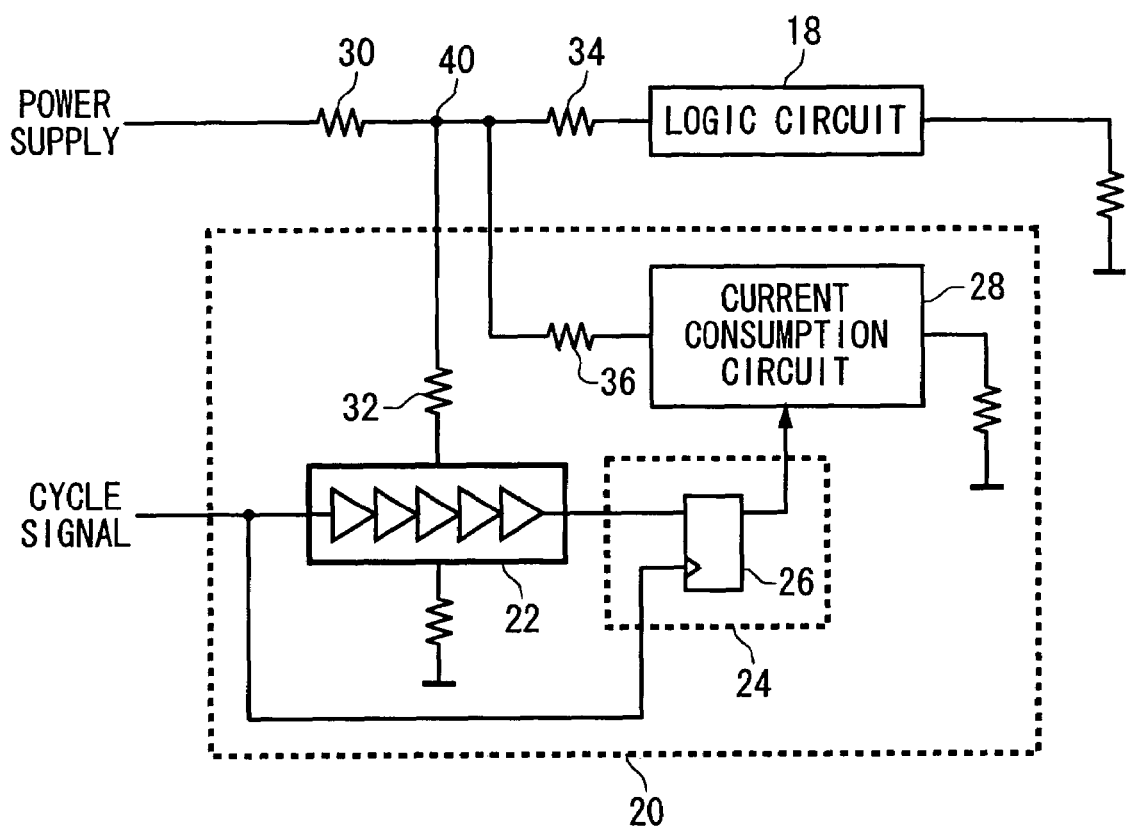
FIG. 2 is a diagram which shows an example of a configuration of the load fluctuation correction circuit 20.

FIG. 2 is a diagram which shows an example of a configuration of the load fluctuation correction circuit 20. The load fluctuation correction circuit 20 detects the change in the source current consumed by the corresponding logic circuit 18. Furthermore, the load fluctuation correction circuit 20 consumes a suitable amount of current so as to correct the change thus detected. That is to say, the load fluctuation correction circuit 20 maintains the sum of the source current consumed by the logic circuit 18 and the source current consumed by the load fluctuation correction circuit 20 at a constant value. With the present embodiment, each logic circuit 18 receives source power from an external power supply through resistors 30 and 34. The resistors 30 and 34 represent the resistances of the bonding wire 14 and the metal wiring pattern 16 described above with reference to FIG. 1, for example. The load fluctuation correction circuit 20 receives the source voltage applied to the corresponding logic circuit 18 at a node 40. The load fluctuation correction circuit 20 is driven by the source voltage thus received. Each load fluctuation correction circuit 20 includes resistors 32 and 36, a delay. circuit 22, a phase comparison circuit 24, and a current consumption circuit 28.

The delay circuit 22 is driven by the source voltage supplied to the corresponding logic circuit 18 as a source voltage thereof. For example, the source voltage is supplied to the delay circuit 22 from the node 40 through the resistor 32. Here, the resistor 32 represents the resistance of a power supply transmission path from the node 40 up to the delay circuit 22.

The delay circuit 22 is designed such that upon receiving the source voltage which is to be supplied to the corresponding logic circuit 18, the delay circuit 22 outputs a cycle signal received from an external circuit with a predetermined delay time. The delay circuit 22 has a function of adjusting the delay amount corresponding to the received source voltage. For example, the delay circuit 22 has multiple buffers connected in series. The source voltage is applied to each buffer. That is to say, the delay circuit 22 converts a change in the source voltage into a change in the delay amount.

Also, the delay circuit 22 controls the delay amount based upon the control data received from a resistor. With such an arrangement, the resistor may supply the control data to the delay circuit 22. Upon the source voltage which is to be supplied to the corresponding logic circuit 18 being applied to the delay circuit 22, the delay circuit 22 controls the delay amount based upon the control data thus received.

The current consumption circuit 28 is provided so as to share a power supply with the logic circuit 18. The current consumption circuit 28 consumes the current received from the power supply through the resistor 36. With such an arrangement, the current consumption circuit 28 is preferably provided near the logic circuit 18. The phase comparison circuit 24 controls the amount of the current consumed by the current consumption circuit 28 such that the phase difference between the cycle signals input to and output from the delay circuit 22 matches a predetermined period of time set as the delay amount of the delay circuit 22. The delay amount of the delay circuit 22 changes corresponding to the source current supplied to the logic circuit 18 and the current consumed by the current consumption circuit 28. With the present embodiment, the consumption current in the current consumption circuit 28 is controlled such that the delay circuit 22 exhibits a predetermined delay amount, thereby maintaining the total current amount consumed by the logic circuit 18 and the current consumption circuit 28 at a constant value.

Such a configuration enables the total current amount consumed by the logic circuit 18 and the corresponding load fluctuation correction circuit 20 to be maintained at a constant value, regardless of the driving state of the logic circuit 18. This allows the source voltage applied to the surrounding logic circuits 18 to be stably controlled, regardless of the driving state of the logic circuit 18.

Note that the resistors 32 and 36 are preferably provided with suitable resistance values so as to ensure that the change in the voltage drop occurring due to the change in the current from the node 40 is suppressed to a negligible value.

Let us say that such an arrangement requires a permissible deviation of 5 ps or less as the delay amount of the delay circuit 22 that occurs due to the change in the source voltage. Furthermore, let us say that the delay circuit 22 changes the delay amount corresponding to the change in the source voltage at a ratio of 8.5 ps/mV. In this case, the permissible change in the source voltage is 0.59 mV. With such an arrangement, the resistors 32 and 36 are provided with appropriate resistance values so as to suppress the change in the voltage drop to 0.59 mV or less, regardless of the change in the current from the node 40. For example, the power transmission distance between the node 40 and the delay circuit 22 may be approximately zero. Also, the power transmission distance between the node 40 and the current consumption circuit 28 may be approximately zero.

On the other hand, the delay circuit 22 is preferably designed such that upon the source voltage to be supplied to the logic circuit 18 being applied to the delay circuit 22, the delay circuit 22 generates a delay amount of the cycle time of the cycle signal multiplied by an integer, or of the half cycle of the cycle signal multiplied by an integer. This facilitates phase comparison by the phase comparison circuit 24. Such an arrangement allows the phase comparison circuit 24 including only a single flip-flop 26 to make a comparison between the phase of the cycle signal and the phase of the signal output from the delay circuit 22. This enables the scale of the circuits to be reduced.

Let us consider an arrangement in which the delay circuit 22 generates a delay of one cycle time of the cycle signal. With such an arrangement, the signal output from the delay circuit 22 is input to the data input terminal of the flip-flop 26. On the other hand, the cycle signal is input to the clock input terminal thereof. With such an arrangement, in a case that the signal output from the delay circuit 22 has a phase lead with respect to the cycle signal, the flip-flop 26 outputs a high-level logic signal. On the other hand, in a case that the signal output from the delay circuit 22 has a phase lag with respect to the cycle signal, the flip-flop 26 outputs a low-level logic signal.

Then, in a case of receiving the high-level logic signal, the current consumption circuit 28 is controlled so as to consume a predetermined amount of current. On the other hand, in a case of receiving the low-level logic signal, the current consumption circuit 28 is controlled so as to suppress the consumption current to approximately zero. Such control operation enables the total current amount consumed by the logic circuit 18 and the current consumption circuit 28 to be maintained at an approximately constant value.

On the other hand, let us consider a arrangement in which the delay circuit 22 generates a delay of the half cycle time of the cycle signal. With such an arrangement, the inverted signal of the signal output from the delay circuit 22 is input to the data input terminal of the flip-flop 26. On the other hand, the cycle signal is input to the clock input terminal thereof. Such a configuration also enables the total current amount consumed by the logic circuit 18 and the current consumption circuit 28 to be maintained at an approximately constant value. Furthermore, such an arrangement has a function of handling fluctuation of the source current supplied to the logic circuit 18 with a response time of a half cycle of the cycle signal. This offers higher speed control operation.

Figure 3:
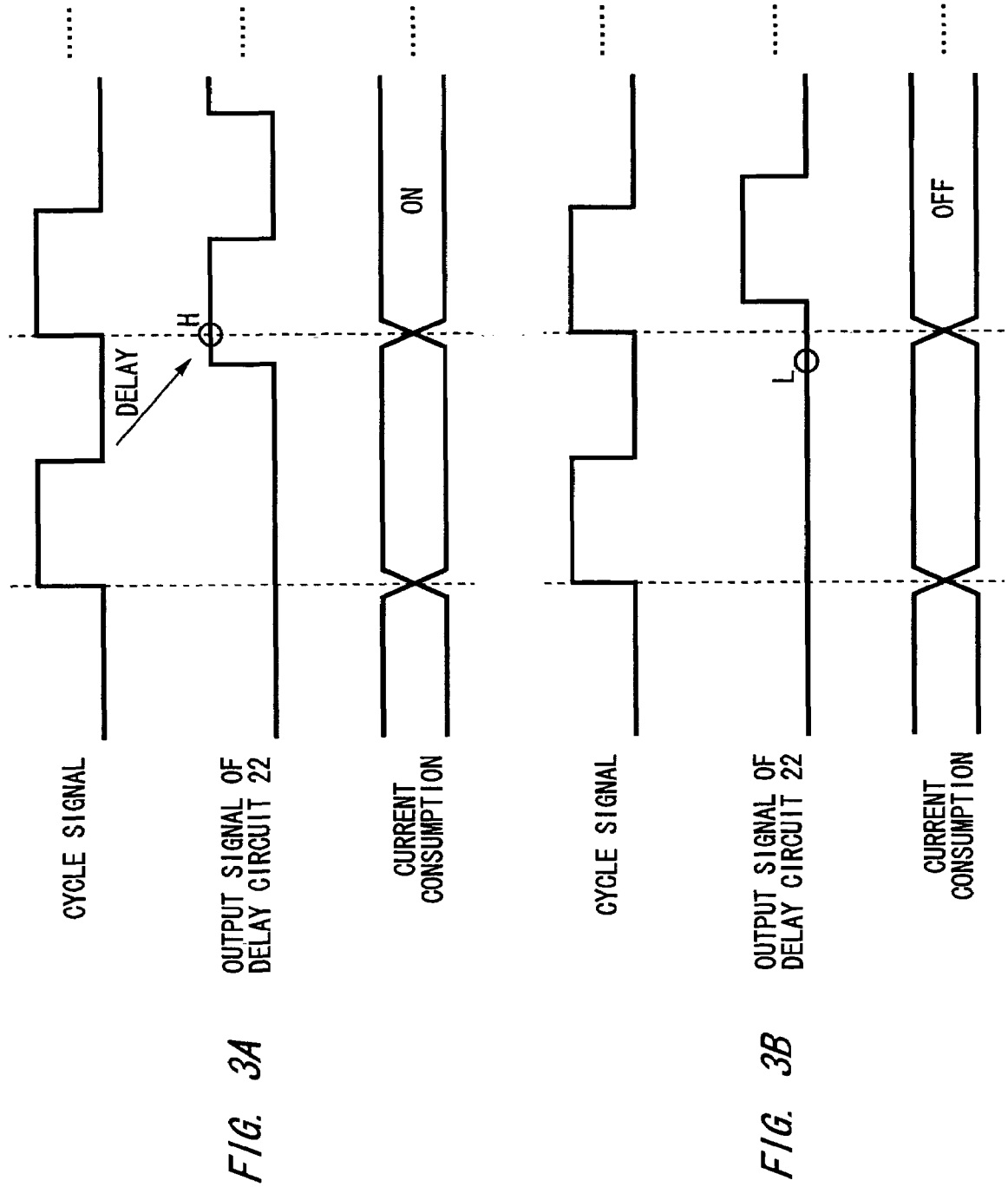
FIG. 3 is a timing chart for describing the operation of a phase comparison circuit 24.

FIG. 3 is a timing chart for describing the operation of the phase comparison circuit 24.

FIGS. 3A and 3B show cases in which the delay circuit 22 generates a delay of an approximately one cycle of the cycle signal.

Specifically, FIG. 3A shows the operation of the phase comparison circuit 24 for handling a situation in which the output signal of the delay circuit 22 has a phase lead with respect to the cycle signal. On the other hand, FIG. 3B shows the operation of the phase comparison circuit 24 for handling a situation in which the output signal of the delay circuit 22 has a phase lag with respect to the cycle signal.

The flip-flop 26 detects the output signal of the delay circuit 22 every time that the rising edge of the cycle signal is input to the clock input terminal thereof. In a case that the signal delayed by one cycle by the delay circuit 22 has a phase lead with respect to the cycle signal input to the delay circuit 22, the flip-flop 26 outputs a high-level logic signal as shown in FIG. 3A. Then, the current consumption circuit 28 is controlled so as to enter the ON state where the current consumption circuit 28 consumes a predetermined amount of current, as described above.

On the other hand, in a case that the signal delayed by one cycle by the delay circuit 22 has a phase lag with respect to the cycle signal input to the delay circuit 22, the flip-flop 26 outputs a low-level logic signal as shown in FIG. 3B. Then, the current consumption circuit 28 is controlled so as to enter the OFF state where the consumption current in the current consumption circuit 28 is suppressed to approximately zero.

Figure 4:
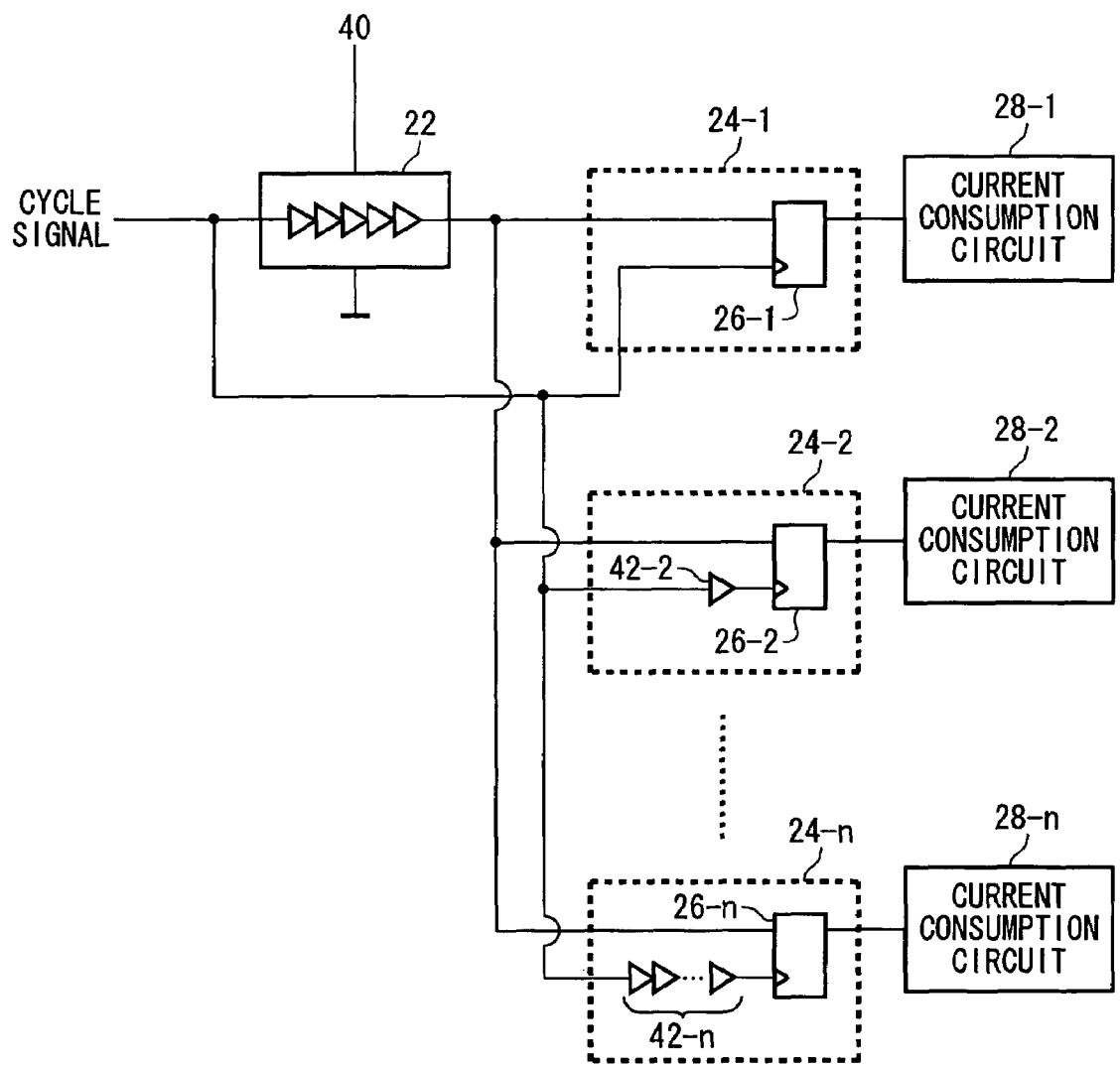
FIG. 4 is a diagram which shows another example of the configuration of the load fluctuation correction circuit 20.

FIG. 4 is a diagram which shows another example of a configuration of the load fluctuation correction circuit 20. Description has been made with reference to FIG. 3 regarding the load fluctuation correction circuit 20 having a function of turning on and off the current consumed by the current consumption circuit 28 corresponding to whether the signal output from the delay circuit 22 has a phase lead or a phase lag with respect to the cycle signal. The load fluctuation correction circuit 20 according to the present example adjusts the current consumed by the current consumption circuit 28 corresponding to the phase difference between the signal output from the delay circuit 22 and the cycle signal. This enables the total current amount consumed by the logic circuit 18 and the current consumption circuit 28 to be maintained with higher precision.

The difference between the load fluctuation correction circuit 20 according to the present example and the load fluctuation correction circuit 20 described with reference to FIG. 2 is as follows. That is to say, the load fluctuation correction circuit 20 according to the present example includes multiple phase comparison circuits 24-1 through 24-n (which will be referred as "phase comparison circuits 24" hereafter) and multiple current consumption circuits 28-1 through 28-n (which will be referred to as "current consumption circuits 28" hereafter). The load fluctuation correction circuit 20 according to the present example has the same configuration as that of the load fluctuation correction circuit 20 described with reference to FIG. 2, except for the aforementioned components.

Also, each of the current consumption circuits 28 has the same function as that of the current consumption circuit 28 described with reference to FIG. 2. Each of the current consumption circuit 28 may have the same current-consumption capacity. Furthermore, the sum of the current-consumption capacities of the multiple current consumption circuits 28 may approximately match the maximum source current supplied to the logic circuit 18. The multiple phase comparison circuits 24 are provided to the corresponding multiple current consumption circuits 28, respectively. Each phase comparison circuit 24 controls whether or not the corresponding current consumption circuit 28 consumes the current.

Each phase comparison circuit 24 further includes the corresponding one of fine delay unit 42-2 through 42-n (which will be referred to as "fine delay units 42" hereafter), in addition to the components of the phase comparison circuit 24 described with reference to FIG. 2. These fine delay units 42 delay the cycle signal with a different delay amount. Each signal thus delayed is input to the clock input terminal of a corresponding flip-flop 26-1 through 26-n (which will be referred to as "flip-flops 26" hereafter). The delay amount of each of the fine delay units 42 is preferably smaller than the delay amount of the delay circuit 22. Furthermore, the delay amounts of these fine delay units 42 differ from one another in increments of a predetermined delay amount.

Each flip-flop 26 makes a comparison between the phase of the cycle signal delayed by the corresponding fine delay unit 42 and the phase of the signal output from the delay circuit 22, and controls the corresponding current consumption circuit 28. Each flip-flop 26 performs the same control operation as that of the flip-flop 26 described with reference to FIG. 2.

Such a configuration enables the total current amount consumed by the logic circuit 18 and the all the current consumption circuits 28 to be maintained at an approximately constant value over the change in the current consumed by the logic circuit 18 from approximately zero up to the maximum amount of the source current.

Also, the load fluctuation correction circuits 20 described with reference to FIGS. 2 through 4 may be provided to all the logic circuits 18, or may be provided to a part thereof. Such an arrangement corrects the change in the current consumption due to the change in the driving state of the logic circuits 18, thereby suppressing fluctuation of the source voltage.

Figure 5:
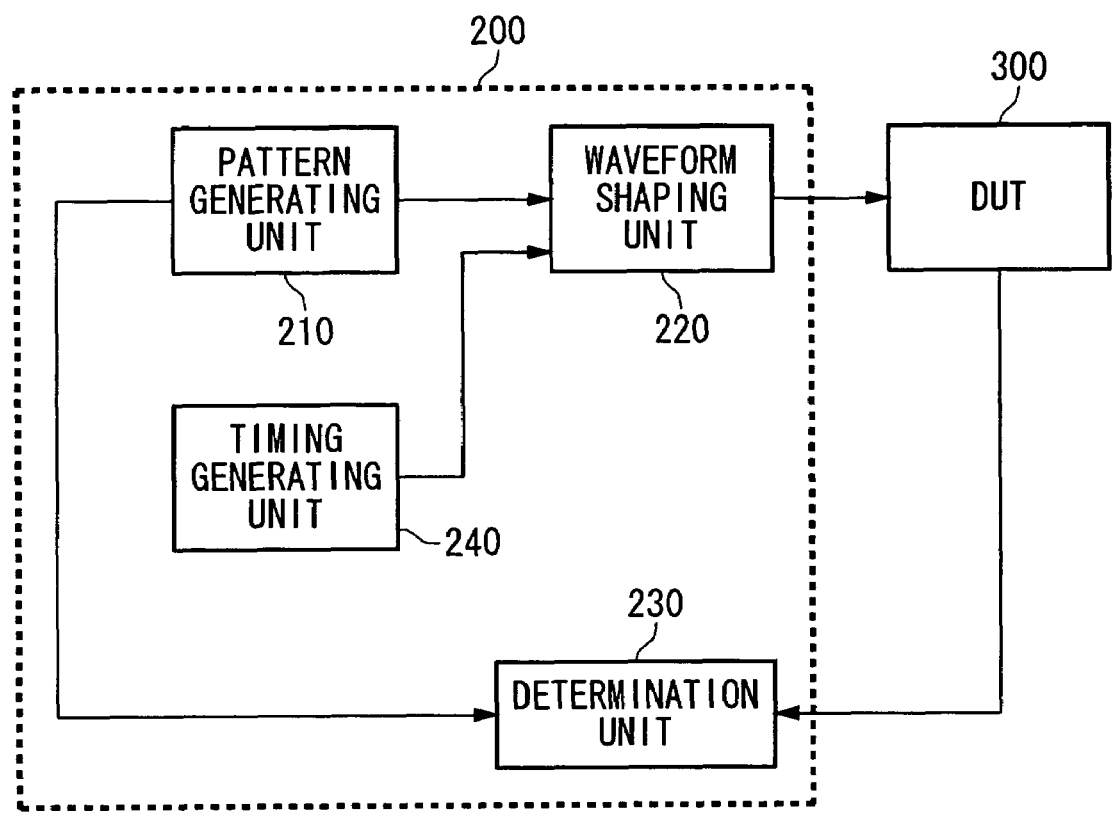
FIG. 5 is a diagram which shows an example of a configuration of a testing device 200.

FIG. 5 is a diagram which shows an example of a configuration of a testing device 200 for testing a tested device 300 such as a semiconductor chip and so forth. The testing device 200 includes a pattern generating unit 210, a waveform shaping unit 220, a determination unit 230, and a timing generating circuit 240.

The pattern generating unit 210 generates a test pattern for testing the tested device 300. For example, the pattern generating unit 210 generates a binary (1/0) test pattern corresponding to the test program received.

The waveform shaping unit 220 creates a test signal to be supplied to the tested device 300, based upon the test pattern. For example, the waveform shaping unit 220 creates a test signal which exhibits the voltage level corresponding to the digital value of the test pattern according to the edge of the timing signal received.

The timing generating unit 240 generates a timing signal which determines the phase of the test signal, and supplies the timing signal thus generated to the waveform shaping unit 220. For example, the timing generating circuit 240 controls the phase of each pulse contained in the received reference clock signal to be a desired phase, and outputs a signal with each phase thus controlled.

The determination unit 230 determines whether or not the tested device 300 is acceptable based upon the output signal output from the tested device 300. For example, the determination unit 230 determines whether or not the tested device 300 is acceptable by making a comparison between the output signal of the tested device 300 and an expected output signal created by the pattern generating unit 210.

Figure 6:
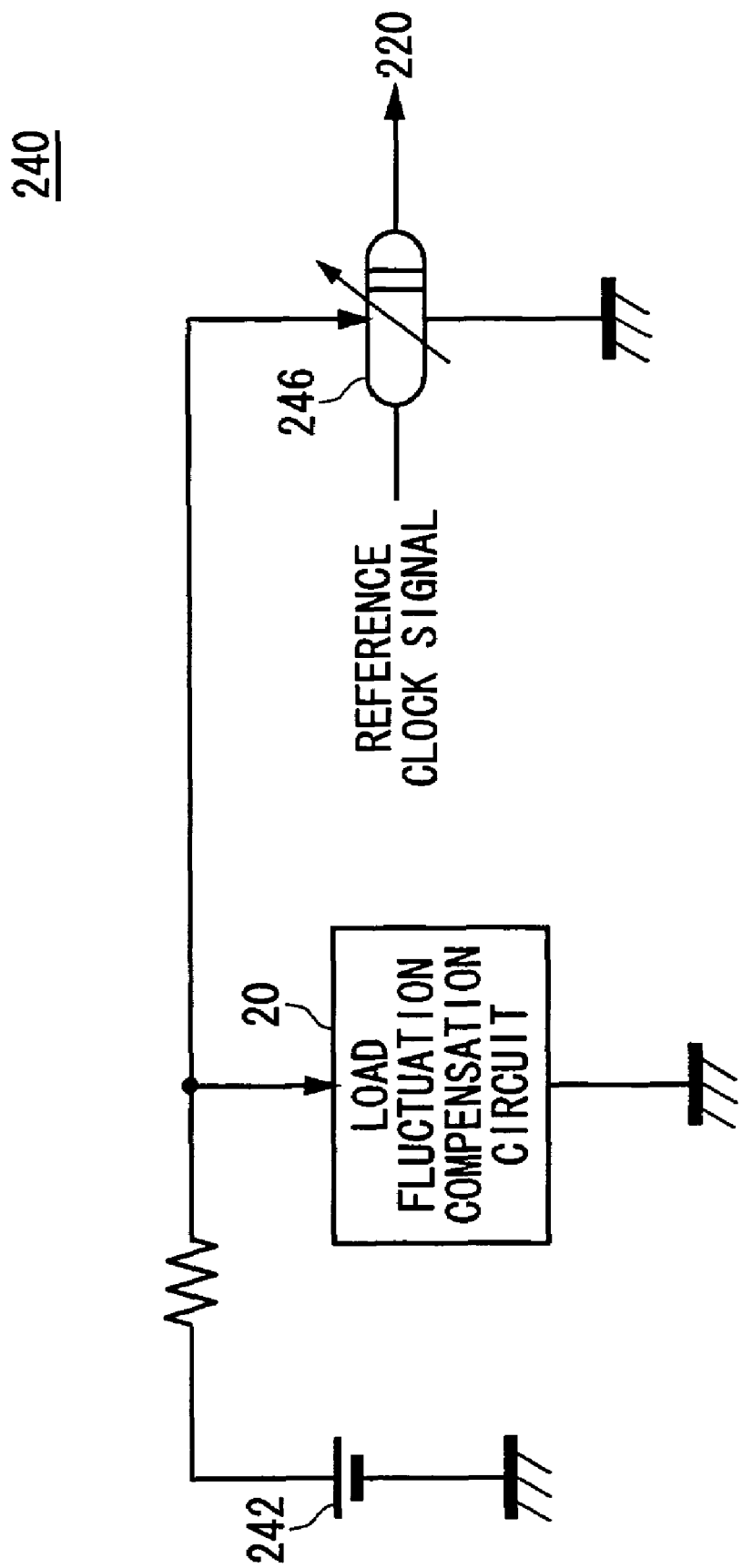
FIG. 6 is a diagram which shows an example of a configuration of a timing generating circuit 240.

FIG. 6 is a diagram which shows an example of a configuration of the timing generating unit 240. The timing generating unit 240 includes a power supply 240, a variable delay circuit 246, and a load fluctuation correction circuit 20. The variable delay circuit 246 delays each pulse contained in the reference clock signal supplied from an external circuit to a desired delay amount so as to create a timing signal.

The power supply 242 supplies the source voltage to the variable delay circuit 246 for driving the variable delay circuit 246. The load fluctuation correction circuit 20 is provided in close proximity and parallel to the variable delay circuit 246 for correcting the source voltage supplied to the variable delay circuit 246. The load fluctuation correction circuit 20 has the same configuration and the same function as that of the load fluctuation correction circuit 20 described with reference to FIGS. 1 through 4.

Description has been made with reference to FIGS. 1 through 4 regarding an arrangement in which the load fluctuation correction circuit 20 corrects the source voltage supplied to the logic circuit 18. The load fluctuation correction circuit 20 according to the present example corrects the source voltage supplied to the variable delay circuit 246. The load fluctuation correction circuit 20 according to the present example performs the same operation as that of the load fluctuation correction circuit 20 described with reference to FIGS. 1 through 4, except for the difference described above.

The timing generating circuit 240 according to the present example has the advantage of suppressing overall fluctuation of the consumption current in all the circuits. This suppresses the load fluctuation in the power supply 242. This suppresses errors in the delay amount generated by the variable delay circuit 246 due to changes in the load. Thus, such an arrangement enables a timing signal to be created with a high-precision controlled phase.

Furthermore, such an arrangement allows the current consumption circuit 20 to operate at high speed. This enables a timing signal to be created with high precision even in a case of creating a high-frequency timing signal.

Furthermore, the testing device 200 employing the timing generating circuit 240 has the advantage of creating a test signal with a high-precision controlled phase. This enables the test of the tested device 300 to be performed with high precision.

While description has been made regarding the present invention with reference to the embodiments, the technical scope of the present invention is not restricted to the precise embodiments described above. It can be readily conceived by those skilled in this art that various changes and modifications may be made. It is needless to say that such various changes and modifications are also encompassed in the technical scope of the present invention as defined in the appended claims.

What is claimed is:

1. A load fluctuation correction circuit which corrects a source voltage supplied to a logic circuit comprising:
   a delay circuit which is designed such that upon said source voltage which is to be supplied to said logic circuit being applied to said delay circuit as a power supply, said delay circuit receives a cycle signal and outputs a delayed cycle signal delayed by a predetermined period of time, and which operates with said source voltage supplied to said logic circuit as the power supply;
   a current consumption circuit provided such that it shares the power supply with said logic circuit and consumes current received from the power supply; and
   a phase comparison circuit which receives said cycle signal input to said delay circuit and said delayed cycle signal output from said delay circuit, compares a phase difference between said cycle signal and said delayed cycle signal, outputs a signal representing the comparison result to said current consumption circuit, instructs said current consumption circuit to consume or not to consume the current based on the comparison result, and controls the current amount consumed by said current consumption circuit such that the phase difference between said cycle signal said delayed cycle signal matches said predetermined period of time,
   wherein power input terminals of said logic circuit, said delay circuit, and said current consumption circuit are connected to the power supply.

2. The load fluctuation correction circuit according to claim 1,
   wherein said delay circuit is designed such that upon said source current which is to be supplied to said logic circuit being applied to said delay circuit as the power supply, said delay circuit outputs said cycle signal with a delay of the cycle of said cycle signal multiplied by an integer, and
   wherein in a case that the signal output from said delay circuit has a phase lead with respect to said cycle signal, said phase comparison circuit instructs said current consumption circuit to consume a predetermined amount of current, and
   wherein in a case that the signal output from said delay circuit has a phase lag with respect to said cycle signal, said phase comparison circuit instructs said current consumption circuit to suppress the current consumption to approximately zero.

3. The load fluctuation correction circuit according to claim 2, wherein said phase comparison circuit includes a flip-flop in which the signal output from said delay circuit or the inverted signal thereof is input to a data input terminal thereof, and said cycle signal is input to a clock input terminal thereof.

4. The load fluctuation correction circuit according to claim 1,
   wherein said delay circuit is designed such that upon said voltage source which is to be supplied to said logic circuit being applied to said delay circuit as the power supply, said delay circuit outputs said cycle signal with a delay of the half cycle of said cycle signal multiplied by an integer, and wherein in a case that the inverted signal of the signal output from said delay circuit has a phase lead with respect to said cycle signal, said phase comparison circuit instructs said current consumption circuit to consume a predetermined amount of current, and wherein in a case that the inverted signal of the signal output from said delay circuit has a phase lag with respect to said cycle signal, said phase comparison circuit instructs said current consumption circuit to suppress the current consumption to approximately zero.

5. The load fluctuation correction circuit according to claim 4, wherein said phase comparison circuit includes a flip-flop in which the signal output from said delay circuit or the inverted signal thereof is input to a data input terminal thereof, and said cycle signal is input to a clock input terminal thereof.

6. The load fluctuation correction circuit according to claim 1, wherein said current consumption circuit is provided near said logic circuit.

7. The load fluctuation correction circuit according to claim 1, wherein the current consumption circuit is provided such that it consumes current received from the power supply through a resistor.

8. An electronic device including a logic circuit, comprising:

a power supply line which supplies electric power to said logic circuit; and a load fluctuation correction circuit which corrects a source voltage supplied to said logic circuit from said power supply line, wherein said load fluctuation correction circuit includes:

a delay circuit which is designed such that upon said source voltage which is to be supplied to said logic circuit being applied to said delay circuit as a power supply, said delay circuit receives a cycle signal and outputs a delayed cycle signal delayed by a predetermined period of time, and which operates with said source voltage supplied to said logic circuit as the power supply;

a current consumption circuit provided such that it shares the power supply with said logic circuit and consumes current received from the power supply; and a phase comparison circuit which receives said cycle signal input to said delay circuit and said delayed cycle signal output from said delay circuit, compares a phase difference between said cycle signal and said delayed cycle signal, outputs a signal representing the comparison result to said current consumption circuit, instructs said current consumption circuit to consume or not to consume the current based on the comparison result, and controls the current amount consumed by said current consumption circuit such that the phase difference between said cycle signal and said delayed cycle signal matches said predetermined period of time, wherein power input terminals of said logic circuit, said delay circuit, and said current consumption circuit are connected to the power supply.

9. The electronic device according to claim 8, wherein said delay circuit is designed such that upon said source current which is to be supplied to said logic circuit being applied to said delay circuit as the power supply, said delay circuit outputs said cycle signal with a delay of the cycle of said cycle signal multiplied by an integer, and wherein in a case that the signal output from said delay circuit has a phase lead with respect to said cycle signal, said phase comparison circuit instructs said current consumption circuit to consume a predetermined amount of current, and wherein in a case that the signal output from said delay circuit has a phase lag with respect to said cycle signal, said phase comparison circuit instructs said current consumption circuit to suppress the current consumption to approximately zero.

10. The electronic device according to claim 9, wherein said phase comparison circuit includes a flip-flop in which the signal output from said delay circuit or the inverted signal thereof is input to a data input terminal thereof, and said cycle signal is input to a clock input terminal thereof.

11. The electronic device according to claim 8, wherein said delay circuit is designed such that upon said voltage source which is to be supplied to said logic circuit being applied to said delay circuit as the power supply, said delay circuit outputs said cycle signal with a delay of the half cycle of said cycle signal multiplied by an integer, and wherein in a case that the inverted signal of the signal output from said delay circuit has a phase lead with respect to said cycle signal, said phase comparison circuit instructs said current consumption circuit to consume a predetermined amount of current, and wherein in a case that the inverted signal of the signal output from said delay circuit has a phase lag with respect to said cycle signal, said phase comparison circuit instructs said current consumption circuit to suppress the current consumption to approximately zero.

12. The electronic device according to claim 11, wherein said phase comparison circuit includes a flip-flop in which the signal output from said delay circuit or the inverted signal thereof is input to a data input terminal thereof, and said cycle signal is input to a clock input terminal thereof.

13. The electronic device according to claim 8, wherein said current consumption circuit is provided near said logic circuit.

14. The electronic device according to claim 8, wherein the current consumption circuit is provided such that it consumes current received from the power supply through a resistor.

15. A load fluctuation correction circuit for a logic circuit operating with a source voltage generated by a power supply, comprising:

a first input connecting between the power supply and the logic circuit;

a second input receiving a cycle signal;

a third input connecting between the power supply and the logic circuit downstream of said first input;

a delay circuit connecting to said first input and supplied with the source voltage and to said second input, said delay circuit receiving the cycle signal through said second input, delaying the received cycle signal by a predetermined period of time, and outputting a delayed cycle signal;

a phase comparison circuit connecting to said second input of and to an output of said delay circuit, said phase comparison circuit comparing a phase difference between said cycle signal received through said second input and said delayed cycle signal received from said delay circuit, said phase comparison circuit outputting a signal representing the comparison result in which the phase difference matches said predetermined period of time; and a current consumption circuit connecting to said third input and sharing the power supply with the logic circuit and consuming current received from the power supply, said current consumption circuit connecting to an output of said phase comparison circuit and receiving said signal representing the comparison result, wherein power input terminals of said logic circuit, said delay circuit, and said current consumption circuit are connected to the power supply, and wherein said phase comparison circuit instructs said current consumption circuit to consume or not to consume the current based on the comparison result.

* * * * *